United States Patent
Bol et al.

(10) Patent No.: US 8,294,492 B2
(45) Date of Patent: Oct. 23, 2012

(54) ULTRA-LOW-POWER CIRCUIT

(75) Inventors: David Bol, Hoeilaart (BE); Denis Flandre, Brussels (BE); Jean-Didier Legat, Louvain-la-Neuve (BE)

(73) Assignee: Universite Catholique de Louvain, Louvain-la-Neuve (BE)

( * ) Notice: Subject to any disclaimer, the term of this patent is extended or adjusted under 35 U.S.C. 154(b) by 438 days.

(21) Appl. No.: 12/598,365

(22) PCT Filed: Apr. 29, 2008

(86) PCT No.: PCT/EP2008/055239
§ 371 (c)(1),
(2), (4) Date: Oct. 30, 2009

(87) PCT Pub. No.: WO2008/132210
PCT Pub. Date: Nov. 6, 2008

(65) Prior Publication Data
US 2010/0134149 A1  Jun. 3, 2010

(30) Foreign Application Priority Data
Apr. 30, 2007  (GB) .................................. 0708324.9

(51) Int. Cl.
H03K 19/00  (2006.01)
H03K 19/094  (2006.01)

(52) U.S. Cl. .................... 326/103; 326/121; 326/122

(58) Field of Classification Search .......... 326/24, 326/83, 103, 121, 122
See application file for complete search history.

(56) References Cited

U.S. PATENT DOCUMENTS

| 3,914,702 | A | * | 10/1975 | Gehweiler | .................... 330/264 |
| 4,532,439 | A | * | 7/1985 | Koike | .................... 326/25 |
| 5,113,150 | A | * | 5/1992 | Waizman | .................... 330/264 |
| 6,169,419 | B1 | | 1/2001 | De et al. | |
| 6,236,613 | B1 | | 5/2001 | Ooishi | |

FOREIGN PATENT DOCUMENTS
WO  WO 00/16483 A  3/2000

OTHER PUBLICATIONS

R. Gonzalez et al., "Supply and Threshold Voltage Scaling for Low Power CMOS", IEEE Journal of Solid-State Circuits, vol. 32 (8), 1997, pp. 1201-1216.

B.H. Calhoun et al., "Modeling and Sizing for Minimum Energy Operation in Sub-threshold Circuits", IEEE Journal ofSolid-State Circuits, vol. 40 (9), 2005, pp. 1772-1786.

(Continued)

*Primary Examiner* — Daniel D Chang
(74) *Attorney, Agent, or Firm* — Bacon & Thomas, PLLC

(57) ABSTRACT

An ultra-low-power transconductance device is provided, (FIG. 1b, FIG. 1c), comprising a series connection of a transistor of a first channel type (A) and a transistor of a second channel type (B), the first channel type having a different polarity than the second channel type. The transistors each have a source, a drain and a gate. The source of the transistor of the first channel type (A) is coupled with the source of the transistor of the second channel type (B) and the drain of the transistor of the first channel type (A) is coupled with the gate of the transistor of the second channel type (B).

9 Claims, 8 Drawing Sheets

OTHER PUBLICATIONS

F. Fallah and M. Pedram, "Standby and Active Leakage Current Control and Minimization in CMOS VLSI Circuits", IEICE Trans. on Electronics, vol. E88-C (4), 2005, pp. 509-519.

A. Keshavarzi et al., "Effectiveness of Reverse Body Bias for Leakage Control in Scaled Dual Vt CMOS ICs", Proc. of the IEEE/ACM International Symposium on Low-Power Electronics and Design, 2001, pp. 207-212.

S. Mutoh et al., "1-V Power Supply High-Speed Digital Circuits Technology with Multi-threshold-Voltage CMOS", IEEE Journal of Solid-State Circuits, vol. 30 (8), 1995, pp. 847-854.

H. Kawaguchi et al., "A Super Cut-Off CMOS (SCCMOS) Scheme for 0.5-V Supply Voltage with Picoampere Stand-by Current", IEEE Journal of Solid-State Circuits, vol. 35 (10), 2000, pp. 1498-1501.

J.P. Kulkarni et al., "A 160mV Robust Schmitt Trigger Based Sub-threshold SRAM", IEEE Journal of Solid-State Circuits, vol. 42 (10), 2007, pp. 2303-2313.

D. Levacq et al., "Low Leakage SOI CMOS Static Memory Cell With Ultra-Low Power Diode", IEEE Journal of Solid-State Circuits, vol. 42 (3), 2007, pp. 689-702.

E. Vittoz and J. Fellrath, "CMOS Analog Integrated Circuits based on Weak-Inversion Operation", IEEE Journal of Solid-State Circuits, vol. SC-12, 1977, pp. 224-231.

Z-H Liu et al., "Threshold Voltage Model for Deep-Submicrometer MOSFET's", IEEE Trans. on Electron Devices, vol. 40 (1), 1993, pp. 86-95.

David Levacq et al.: "Low Leakage SOI CMOS Static Memory Cell with Ultra-Low Power Diode", IEEE Journal of Solid-State Circuits, IEEE Service Center, Piscataway, NJ, US, vol. 42, No. 3, Mar. 1, 2007, pp. 689-702, XP011171992.

\* cited by examiner

ULTRA-LOW-POWER CIRCUIT

TECHNICAL FIELD OF THE INVENTION

The present invention relates to ultra-low-power circuits with high-speed devices, more particularly to ultra-low-power transconductance circuits and applications thereof.

BACKGROUND OF THE INVENTION

The increasing demand for digital Integrated Circuits (IC) comes with a diversification of the target applications. IC designers are facing new challenges to meet the various design constraints imposed by the customers, from high-end ultrafast designs to low-frequency low-cost ultra-low-power applications. At the same time, the scaling trend of MOSFET leads to the development of nanoscale CMOS processes driven by Moore's law. This development comes at the expense of high leakage currents. When working on low-frequency ultra-low-power applications, the overall power consumption is no longer dominated by dynamic power but by static power due to leakage currents, especially with deep submicron technologies.

The design scope of CMOS digital IC's can be divided into three categories. In the first category stand the high-end applications that have to support GHz-range operating frequencies to build competitive computers, super-calculators, etc. The important figure of merit of performance for digital IC's from this category is the energy-delay product. Static and dynamic CMOS circuits have proven their efficiency for these applications.

In the second category of CMOS digital IC's stand the portable applications like cell phones and PDA's that need to operate with minimum energy per operation. Minimization of the energy per operation can be achieved by lowering the power supply. Therefore, static sub-threshold CMOS circuits are very effective for these applications, as described by R. Gonzalez, B. Gordon and M. Horowitz in "Supply and Threshold Voltage Scaling for Low Power CMOS", IEEE Journal of Solid-State Circuits, Vol. 32 (8), 1997, pp. 1210-1216.

The third category contains the ultra-low-power applications. Such circuits either have to operate during a long period with reduced battery capacity or are scavenging energy from the environment. Design has to be low cost avoiding off-chip components like extra bias voltage supplies. Typical application domains are wristwatches, bio-medical implanted devices, sensor networks, RFID's (radio frequency identification). These circuits often have to perform its task in a slow repetitive fashion. Therefore, the figure of merit for performance considered here is no longer the energy per operation but the total energy consumed during one task repetition period. This energy comes from the dynamic and static power consumption as:

$$E_T = N_{SW} \frac{C_{TOT} V_{DD}^2}{2} + V_{DD} \times I_{STAT} \times T_{PER} \quad (1)$$

where $N_{SW}$ is the number of node switchings to perform one occurrence of the task. $C_{TOT}$ is the total switched capacitance of the circuit, $V_{DD}$ the power supply, $I_{STAT}$ the total static current of the circuit and $T_{per}$ is the task repetition period. The timing constraint is given by the task execution time that has to be smaller than $T_{per}$. If $T_{per}$ is long for the ultra-low-power applications, the main part of the consumed energy comes from the static power dissipation. Reduction of the static power can be achieved again by lowering $V_{DD}$. However, there is a lower bound for $V_{DD}$ because of the degradation of the CMOS gate output swing, as described by B. H. Calhoun, A. Wang and A. Chandrakasan in "Modeling and Sizing for Minimum Energy Operation in Sub-threshold Circuits", IEEE J. of Solid-State Circuits, Vol. 40 (9), 2005, pp. 1778-1786. The static power consumption cannot be reduced by orders of magnitude by lowering $V_{DD}$. Efforts are thus devoted to the minimization of the static current. Static current of digital CMOS gates is given by the OFF-current $I_{OFF}$ of the devices at gate-to-source voltage $V_{GS}=0V$. $I_{OFF}$ is due to the leakage currents: gate, junction leakage and sub-threshold channel leakage currents. In deep-submicron technologies, sub-threshold current is the dominating leakage source, as acknowledged in F. Fallah and M. Pedram in "Standby and Active Leakage Current Control and Minimization in CMOS VLSI Circuits", IEICE Trans. on Electronics, Vol. E88-C (4), 2005, pp. 509-519. In this patent, focus is placed on the reduction of the sub-threshold current. The goal is to lower this leakage source to the current level of the other leakage sources in order to minimize the total static current of digital gates.

Sub-threshold leakage current depends exponentially on the device threshold voltage $V_T$. It increases dramatically as $V_T$ is lowered to keep high-driving capability of high-speed technologies when scaling $V_{DD}$. The traditional way of limiting sub-threshold leakage is to use high-$V_T$ devices to implement the digital gates. This is a very efficient technique but it requires the use of a high-$V_T$ process. Another technique to reduce the sub-threshold leakage is the application of a reverse body bias. However, it has been shown by A. Keshavarzi, S. Ma, S. Narendra, B. Bloechel, K. Mistry, T. Ghani, S. Borkar and V. De in "Effectiveness of Reverse Body Bias for Leakage Control in Scaled Dual Vt CMOS ICs", Proc. of the IEEE/ACM International Symposium on Low-Power Electronics and Design, 2001, pp. 207-212, that reverse body bias has limited effectiveness at shorter channel lengths and low $V_T$. It also increases junction leakage and two extra bias voltage supplies are needed too, which is a problem regarding low-cost integration.

Other static current reduction techniques are based on sleep-mode features. After having achieved the task in active mode, the circuit goes into sleep-mode for the remaining part of $T_{per}$. In sleep mode, sub-threshold leakage current and thus static current is lowered by gating the power supply with high-$V_T$ cut-off devices, as described by S. Mutoh, T. Douseki, Y. Matsuya, T. Aoki, S. Shigematsu and J. Yamada in "1-V Power Supply High-Speed Digital Circuits Technology with Multi-threshold-Voltage CMOS", IEEE J. of Solid-State Circuits, Vol. 30 (8), 1995, pp. 847-854. A dual-$V_T$ process is required. Power gating can be achieved with single-$V_T$ process by overdriving the gate of the cut-off devices with negative $V_{GS}$. This is described by H. Kawaguchi, K. Nose and T. Sakurai in "A Super Cut-Off CMOS (SCCMOS) Scheme for 0.5-V Supply Voltage with Picoampere Stand-By Current", IEEE J. of Solid-State Circuits, Vol. 35 (10), 2000, pp. 1498-1501. As with the reverse-body-bias technique, the drawback is the need for extra bias voltage supplies.

SUMMARY OF THE INVENTION

It is an object of the present invention to provide a transconductance circuit which allows obtaining very low sub-threshold leakage in active mode.

It is an advantage of transconductance circuits according to the concept of the present invention that they use negative $V_{GS}$ of cut-off devices by self-biasing, i.e. without the need for extra bias voltage supplies or dual-$V_T$ process.

Embodiments of the present invention allow, starting from two semiconductor devices of the transistor type having a high leakage current, building a structure having the functionality of a transistor, but with a very low leakage current. In particular in the case of CMOS technology, a transconductance circuit according to embodiments of the invention comprises an N-type MOSFET and a P-type MOSFET.

The above objective is accomplished by an Ultra-Low-Power (ULP) transconductance device according to embodiments of the present invention. Such ULP transconductance device comprises a series connection of a transistor of a first channel type and a transistor of a second channel type, the first channel type having a different polarity than the second channel type, the transistors each having a source, a drain and a gate, whereby the source of the transistor of the first channel type is coupled with the source of the transistor of the second channel type, and the drain of the transistor of the first channel type is coupled with the gate of the transistor of the second channel type.

According to embodiments of the invention, a body of the transistor of the first channel type may be connected to ground and a body of the transistor of the second channel type is connected to a power supply.

The ULP transconductance circuit according to embodiments of the present invention behaves as an N-type or a P-type transistor, depending on the assembly method. It allows a reduction of leakage current of at least 3 orders of magnitude.

An Ultra-Low-Power (ULP) transconductance circuit according to embodiments of the present invention has the advantage that it does not require changes to the method of fabrication of circuits in order to reduce the leakage current. The leakage current reduction is obtained by the simple combination of the two transistors. Therefore, the invention does not incur supplementary costs in the development of fabrication of integrated circuits, nor in the fabrication of the circuits themselves.

The ULP transconductance circuit allows the circuit to remain active all the time, with the reduction of leakage currents always operational. No sleep mode is required to obtain the power consumption reduction.

No different threshold voltages need to be provided for different devices. In accordance with embodiments of the present invention, NMOS and PMOS devices have the same threshold voltage. Providing devices with different threshold voltages forms a supplementary cost in the fabrication of the masks.

Furthermore, in accordance with embodiments of the present invention, a new simple design technique is proposed for digital circuits to benefit from the small area and the low dynamic power consumption of high-speed deep-submicron devices while keeping low leakage currents, for low-frequency applications. The technique is based on the ULP transconductance concept in accordance with embodiments of the present invention. It operates with self-biased negative gate-to-source voltage and maintains a very low sub-threshold leakage current even with high-speed low-threshold-voltage devices.

In accordance with embodiments of the present invention, a novel leakage reduction technique for digital IC's is presented. It targets low-cost Ultra-Low-Power (ULP) applications with low operating frequencies. The ULP transconductance concept in accordance with embodiments of the present invention drastically reduces leakage current by negative $V_{GS}$ self-biasing. It is a straightforward low-cost technique that only uses standard CMOS devices and does not require extra bias voltage nor high-$V_T$ devices. ULP CMOS logic gates built with this technique allow reduction of the sub-threshold current by several orders of magnitude, at the expense of the gate delay. Static current reduction is only limited in the pA range by the drain-to-body junction leakage and gate leakage.

The obtained ULP structures may be used for realising basic blocs of electronic circuits, such as logic gates (inverter, AND, OR, NAND, NOR, etc.). Such logic gates according to embodiments of the present invention have a very low static current compared to standard gates, traded off with speed. Therefore, the consumption of digital circuits operated at slow speed may be considerably reduced if realised based on logic gates in accordance with embodiments of the present invention. The power consumption of ULP CMOS gates in accordance with embodiments of the present invention at low operating frequencies lies in the pW range, whereas standard CMOS gates have nW-range power consumption at the same operating frequencies in the kHz range due to static power. SPICE simulations show that, with the considered 0.13-μm process (channel length), neither reverse body bias technique nor sub-threshold operation nor high-$V_T$ devices allow power consumption to be so low.

The logic gates according to embodiments of the present invention show hysteresis in the transfer characteristic of voltage between input and output. This is very interesting in low-voltage ultra-low-power RAM memories with sufficient noise margins as proposed by J. P. Kulkarni, K. Kim and K. Roy in "A 160 mV Robust Schmitt Trigger Based Subthreshold SRAM", IEEE Journal of Solid-State Circuits, Vol. 42 (30), 2007, pp. 2303-2313. Therefore, a logic gate of the inverter type may be used for making RAM memories with very low power consumption and having noise margins above $V_{DD}/2$.

The long delay of logic gates according to embodiments of the present invention may be used for realising time-to-digital converters with very low power consumption. This type of converters may be used in integrated sensors, such as temperature sensors, flux sensors, pressure sensors, etc. A measurement method for measuring these phenomena is to produce a difference in delay of the logic gates, either directly or by using MEMS providing a variable capacitance. In the case of standard logic gates, the delay is limited, and measuring the delay requires a cascade of lots of logic gates in order to provide a larger time basis and thus a better precision for the delay to be measured. This significantly raises the power consumption and the surface of the circuit. With the logic gates according to embodiments of the present invention, the time basis is larger by itself, and a reduced number of logic gates allows to obtain a good precision for the measurement.

The ULP leakage reduction technique in accordance with embodiments of the present invention is very robust against process, voltage and temperature (PVT) variations. Static current of ULP CMOS gates according to embodiments of the present invention remains stable over a wide PVT operating condition window. In particular this technique is very efficient at high temperature as static current can be kept in the pA range by the use of power supply voltage somewhat higher.

In a further aspect, the present invention also provides an ultra-low-power logic gate circuit comprising at least one ultra-low-power transconductance device according to embodiments of the present invention.

In another aspect, the present invention also provides an ultra-low-power inverter circuit wherein a first and a second ultra-low-power transconductance device according to embodiments of the invention are connected together, each of the ultra-low-power transconductance devices having a gate, a source and a drain, the first channel type of the first ultra-low-power transconductance device being different from the first channel type of the second ultra-low-power device, wherein the sources of the first and the second ultra-low-power device are connected together and wherein the gates of the first and the second ultra-low-power transconductance device are connected together.

The present invention also provides the use of an ultra-low-power inverter circuit according to embodiments of the invention to form an ultra-low-power SRAM cell.

The present invention also provides the use of an ultra-low-power inverter circuit according to embodiments of the invention to form an ultra-low-power latch.

The present invention also provides the use of an ultra-low-power inverter circuit according to embodiments of the invention to form an ultra-low-power ring oscillator.

In a further aspect, the present invention provides a ring oscillator comprising a plurality of ultra-low-power inverter circuits according to embodiments of the invention connected to each other in series.

In a further aspect, the present invention provides an SRAM cell comprising at least one ultra-low-power inverter circuit according to embodiments of the invention.

In a further aspect, the present invention provides a time-to-digital converter comprising at least one ultra-low-power inverter circuit according to embodiments of the invention.

In a further aspect, the present invention provides a latch comprising at least one ultra-low-power inverter circuit according to embodiments of the invention.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figure 1A:
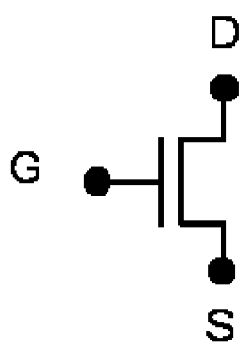
FIG. 1(a) illustrates a standard NMOS device.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

It will be clear for a person skilled in the art that the present invention is also applicable to similar devices that can be configured in any transistor technology, including for example, but not limited thereto, CMOS, BICMOS, Bipolar and SiGe BICMOS technology. Furthermore the findings of the present invention are explained with reference to PMOS and NMOS transistors as an example, but the present invention includes within its scope a complementary device whereby PMOS and NMOS transistors become NMOS and PMOS transistors, respectively. A skilled person can make such modifications without departing from the true spirit of the invention.

The present invention provides an ultra-low-power transconductance device comprising a series connection of a transistor of a first channel type and a transistor of a second channel type, the first channel type having a different polarity than the second channel type and the transistors each having a first and a second main electrode, e.g. a source and a drain and a control electrode, e.g. a gate. The source of the transistor of the first channel type is coupled with the source of the transistor of the second channel type and the drain of the transistor of the first channel type is coupled with the gate of the transistor of the second channel type.

Transconductance circuits according to embodiments of the present invention use negative $V_{GS}$ of cut-off devices by self-biasing, i.e. without the need for extra bias voltage supplies or dual-VT process.

Embodiments of the present invention allow, starting from two semiconductor devices of the transistor type having a high leakage current, building a structure having the functionality of a transistor, but with a very low leakage current. In particular in the case of CMOS technology, a transconductance circuit according to embodiments of the invention comprises an N-type MOSFET and a P-type MOSFET.

An ULP transconductance circuit according to embodiments of the present invention allows a reduction of leakage current of at least 3 orders of magnitude as compared to standard NMOS devices.

An ULP transconductance circuit according to embodiments of the present invention does not require changes to the method of fabrication of circuits in order to reduce the leakage current. The leakage current reduction is obtained by the simple combination of the two transistors. Therefore, the invention does not incur supplementary costs in the development of fabrication of integrated circuits, nor in the fabrication of the circuits themselves.

An ULP transconductance circuit according to embodiments of the invention allows the circuit to remain active all the time, with the reduction of leakage currents always operational. No sleep mode is required to obtain the power consumption reduction.

No different threshold voltages need to be provided for different devices. In accordance with embodiments of the present invention, devices of the first channel type and devices of the second channel type, e.g. NMOS and PMOS devices, have the same threshold voltage. Providing devices with different threshold voltages forms a supplementary cost in the fabrication of the masks.

In the further description transistors of the first channel type and transistors of the second channel type will be referred to as transistors of a first type and transistors of a second type. For example, transistors of N-channel type will be referred to as N-type transistors, while transistors of a P-channel type will be referred to as P-type transistors.

First, the concept of the ULP transconductance device, e.g. transistor, according to embodiments of the present invention is presented: its structure, the leakage reduction mechanism and its current-voltage characteristics.

Figure 1B:
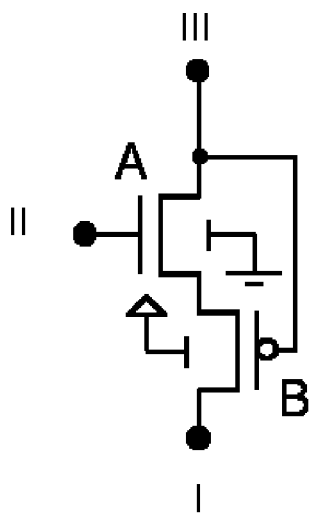
FIG. 1(b) illustrates an N-type ULP transistor according to embodiments of the present invention and FIG. 1(c) illustrates a P-type ULP transistor according to embodiments of the present invention.
Figure 1C:
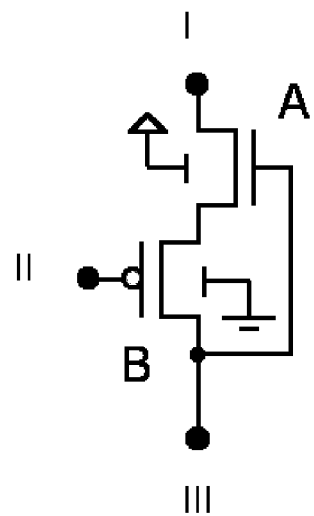

The ULP transistor concept according to embodiments of the present invention is illustrated in FIG. 1(b) and FIG. 1(c). The structures of N-type and P-type ULP transistors are depicted in FIG. 1(b) and FIG. 1(c), respectively, and compared to the standard NMOS device as illustrated in FIG. 1(a).

As the principle of the P-type ULP transistor is similar to the N-type, hereinafter only the N-type ULP transistor is discussed. This is, however, not intended to be limiting for the invention, and P-type ULP transistors are also included in the scope of the present invention.

An N-type ULP transistor according to embodiments of the present invention is composed by an NMOS device A, e.g. transistor, stacked upon a PMOS device B, e.g. transistor, as illustrated in FIG. 1(b) for the case where the NMOS and PMOS devices are MOSFETs. The NMOS and PMOS devices A and B each have at least three electrodes, of which at least one controls in an exponential manner the value of the current flowing between two of the other electrodes. The devices A and B may be field effect semiconductor devices, e.g. MOSFETs, operated in weak inversion mode. The NMOS and PMOS devices A, B are operated with a negative gate voltage, or negative gate-source voltage for the case of MOSFETs, which implies by an exponential dependency of the current, a current level which is reduced by a plurality of orders of magnitude with regard to the nominal current of the devices A and B taken separately. Operating MOSFETs with a negative gate-source voltage induces a functioning in weak inversion, if the MOSFETs are standard devices, i.e. enhancement type transistors, and thus with positive threshold voltage. In the weak inversion mode, the current of the MOSFETs depends exponentially on the gate-source voltage (control voltage). The formed ULP transconductance device, as will be shown below, behaves as a transistor with very low leakage current, and may be used for forming logic gates with very low static power consumption.

The source of the NMOS device A is coupled with the source of the PMOS device B. The gate of the PMOS device B is connected to the NMOS drain. The NMOS body is connected to the ground whereas the PMOS body is connected to the power supply. For symmetry purpose, the value of the PMOS width is chosen as the value of the NMOS width multiplied by the inverse of the carrier mobility ratio. The structure behaves externally as an NMOS transistor with 3 accesses: gate (G) II, source (S) I and drain (D) III.

A standard NMOS device as illustrated in FIG. 1(a) with the source tied to ground is first considered. Its OFF-current $I_{OFF,std}$ is given by three leakage sources: sub-threshold leakage, gate leakage and junction leakage. Focus is put on the sub-threshold leakage current, which is given by the drain current in weak inversion regime. From D. Levacq, V. Dessard and D. Flandre in "Low Leakage SOI CMOS Static Memory Cell With Ultra-Low Power Diode", IEEE J. of Solid-State Circuits, Vol. 42 (3), 2007, pp. 689-702, it can be approximated by:

$$I_{SUB,std} = I_0 \times e^{\frac{V_{BS}(n-1)}{nU_{th}}} \times e^{\frac{V_{GS}-V_{T0}+\Delta V_T}{nU_{th}}} \times \left(1 - e^{\frac{-V_{DS}}{U_{th}}}\right) \quad (2)$$

$$I_{SUB,std}|_{OFF} = I_0 \times e^{\frac{-V_{T0}+\Delta V_T}{nU_{th}}} \times \left(1 - e^{\frac{-V_{DS}}{U_{th}}}\right)$$

where, $I_0$ is a reference current, $V_{BS}$ is the body-to-source voltage, n is the body effect factor and $U_{th}$ is the thermal voltage equal to kT/q. $V_{T0}$ is the threshold voltage at $V_{BS}=0V$ and $V_T$ represents the $V_T$ roll-off due to Drain-Induced Barrier Lowering (DIBL) with short channel devices. From E. Vittoz and J. Fellrath in "CMOS Analog Integrated Circuits based on Weak-Inversion Operation", in IEEE J. of Solid-State Circuits, Vol. SC-12, 1977, pp. 224-231, $V_T$ can be modelled as:

$$\Delta V_T = \theta_{DIBL} \times (\eta + \eta_B V_{BS}) \times V_{DS} \quad (3)$$

where $\theta_{DIBL}$ is the DIBL short-channel effect coefficient, $\eta$ and $\eta_B$ are fitting parameters.

Figure 2:
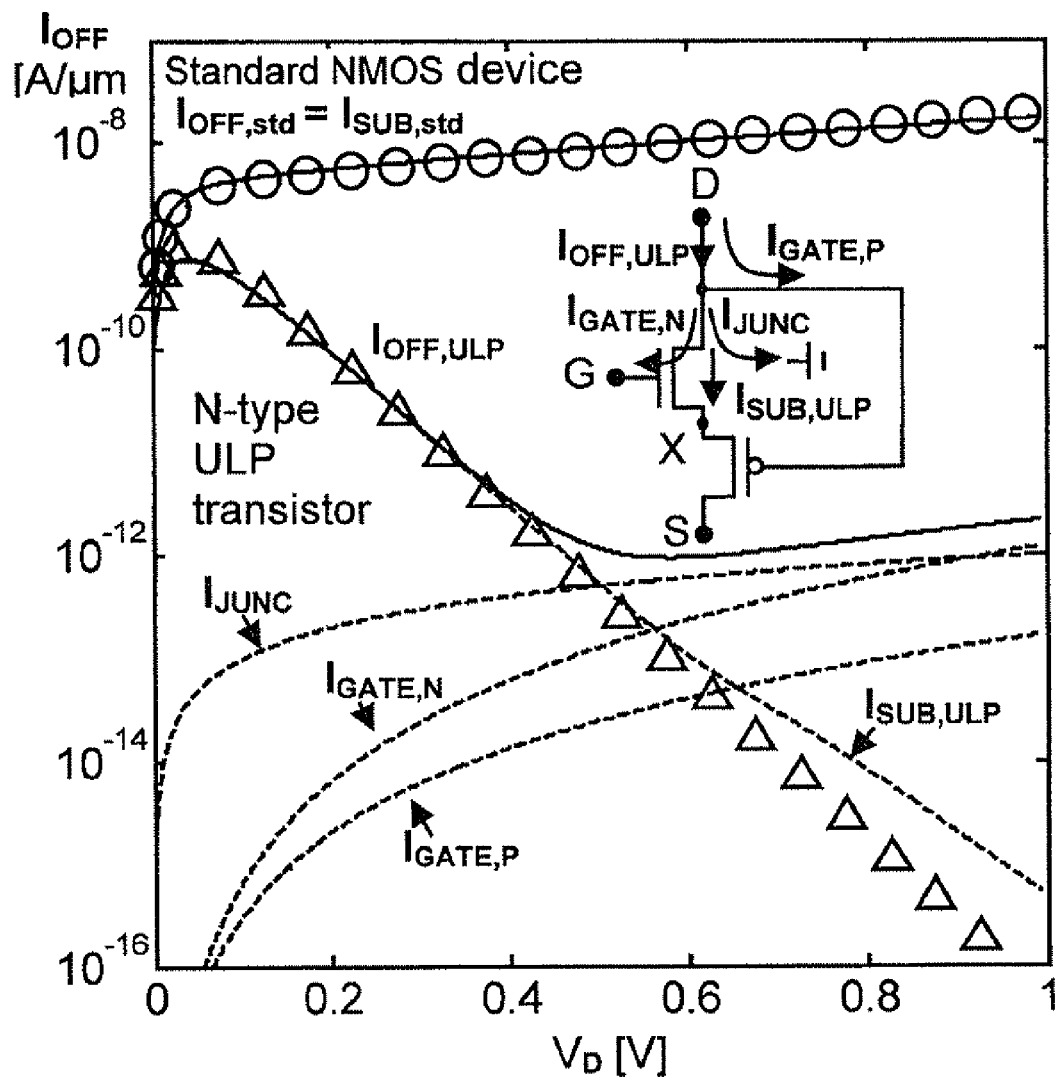
FIG. 2 illustrates $I_{OFF}$ curves with the leakage current contributions (plain lines: SPICE simulation of total OFF-currents, dashed lines: SPICE simulation of ULP leakage current contributions, circles: model of standard NMOS device OFF-current from Equation (2), triangles: model of N-type ULP transistor OFF-current from Equation (4) with $W_N=1$ μm, $W_P=2.4$ μm, $L=0.13$ μm, $T=27°$ C.).

SPICE simulation of $I_{OFF,std}$ is carried out with BSIM3 models of 0.26V-$V_T$ devices from an industrial 0.13-µm bulk CMOS process with 2.5-nm $T_{OX}$. FIG. 2 shows OFF-current $I_{OFF,std}$ versus drain voltage $V_D$ from SPICE simulation ($I_{SUB,std}$ plain line) and sub-threshold current expression from Equation (2) (circles). The sub-threshold current expression is in very good agreement with SPICE simulation. Other leakage sources are negligible as compared to sub-threshold current. Total $I_{OFF,std}$ current is thus substantially equal to $I_{SUB,std}$.

Now an N-type ULP transistor according to embodiments of the present invention is considered. In the present description, upper case letters make reference to the global accesses of the N-type ULP transistor (G, S, D, or II, I, III) whereas lower case letters make reference to the accesses of the internal CMOS devices within the ULP transistor. The leakage reduction mechanism according to embodiments of the present invention is based on the selfbiased negative $V_{gs}$ of the NMOS and PMOS devices inside the ULP transistor. For the N-type ULP transistor from FIG. 1(b), $V_{gs}$ of the NMOS and PMOS devices depend on the voltage of the internal node X. $V_{gs}$ of the NMOS is $V_{GX}$, whereas $V_{gs}$ of the PMOS is $V_{DX}$. The devices have symmetrical $V_T$ and the ratio between the width of the PMOS and the NMOS is the inverse of the carrier mobility ratio. Body of the NMOS is connected to S whereas body of the PMOS is connected to D. Therefore by symmetry, when $V_G=0$, $V_X$ is equal to $V_D/2$. Devices thus operate with $V_{gs}$ equal to $-V_D/2$, leading to ultra-low leakage. The NMOS device of the ULP transistor has a $V_{gs}$ of $-V_D/2$, $V_{ds}$ of $V_D/2$ and $V_{bs}$ of $-V_D/2$.

Replacing these terms in Equation (2) yields the drain sub-threshold leakage current of an N-type ULP transistor with its gate-to-source voltage equal to 0 as:

$$I_{SUB,ULP}|_{OFF} = I_0 \times e^{\frac{-V_D(n-1)}{2nU_{th}}} \times e^{\frac{-V_{D/2}-V_{T0}+\Delta V_T}{nU_{th}}} \times \quad (4)$$

$$\left(1 - e^{\frac{-V_D}{2U_{th}}}\right)$$

$$= I_0 \times e^{\frac{-V_{T0}+\Delta V_T}{nU_{th}}} \times \left(e^{\frac{-V_D}{2U_{th}}} - e^{\frac{-V_D}{U_{th}}}\right)$$

where $\Delta V_T = \theta_{DIBL} \times (\eta - \eta_B V_D/2) \times (-V_D/2)$.

FIG. 2 shows the sub-threshold current of an N-type ULP transistor according to embodiments of the invention from SPICE simulation ($I_{SUB,ULP}$ dashed line) and from Equation (4) (triangles). When VD increases, the sub-threshold current first increases because $V_{ds}$ of the NMOS and PMOS devices increase too. Then, it strongly decreases as $V_{gs}$ of the devices become more and more negative. The agreement between the simulated curve $I_{SUB,ULP}$ (dashed line) and the one from Equation (4) (triangles) is very good until $V_D=0.5V$. The discrepancy when $V_D$ is higher than 0.5V is due to a mismatch between $V_T$ of standard NMOS and PMOS devices (0.26V and 0.31V, respectively). The structure is not exactly symmetrical making $V_X$ slightly different from $V_D/2$ ($V_X=0.46V$ at $V_D=1V$).

The sub-threshold current of ULP transistor $I_{SUB,ULP}$ at 1V is reduced by several orders of magnitude, e.g. at least 3 or 4 orders of magnitude, and even up to 7 orders of magnitude as compared to the sub-threshold current $I_{SUB,std}$ of the standard NMOS device. However in opposition to standard NMOS device, $I_{OFF,ULP}$ of ULP transistor does not only depend on sub-threshold current. FIG. 2 shows the other leakage sources (dashed lines, $I_{JUNC}$, $I_{GATE,N}$ and $I_{GATE,P}$). $I_{JUNC}$ is the drain-to-body junction leakage of the NMOS with its body tied to ground, $I_{GATE,N}$ is the gate leakage of the NMOS from the drain D and $I_{GATE,P}$ is the gate leakage of the PMOS. When $V_D$ is higher than 0.5V, the junction leakage is not negligible anymore. Above 0.9V, the NMOS gate leakage becomes important. The PMOS gate leakage is negligible even at high $V_D$, as the gate leakage of standard PMOS devices is typically one order of magnitude lower than gate leakage of standard NMOS devices, under the same bias-voltage conditions.

Junction leakage and NMOS gate leakage give a lower bound on the achievable OFF-current ($I_{OFF,ULP}$ plain line). There is an optimum $V_D$ voltage for minimum $I_{OFF,ULP}$ round 0.6V, $I_{OFF,ULP}$ is reduced by 4 orders of magnitude as compared to standard NMOS device $I_{OFF,std}$.

Drain-current/gate-voltage characteristics are now considered.

Figure 3:
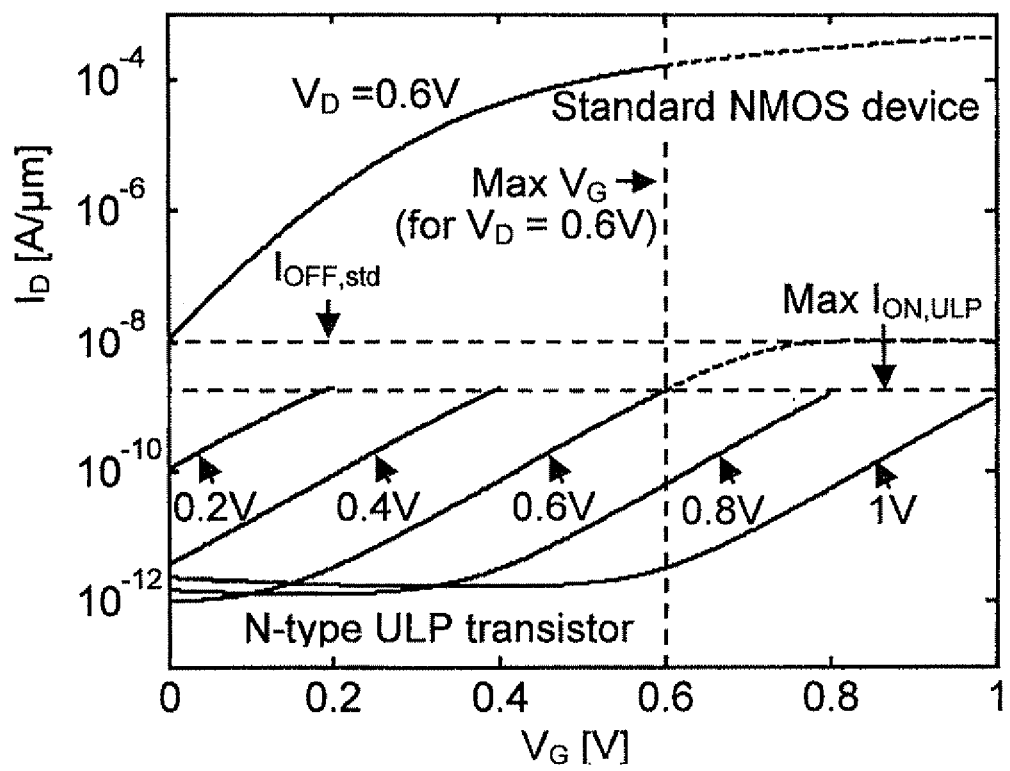
FIG. 3 illustrates ID/VG curves of an ULP transistor in accordance with an embodiment of the present invention (SPICE simulation with $W_N=1$ μm, $W_P=2.4$ μm, $L=0.13$ μm, $T=27°$ C.).

The ULP transistor in accordance with embodiments of the present invention can be analyzed in terms of the typical DC characteristic: $I_D/V_G$ curves. FIG. 3 shows the SPICE-simulated $I_D/V_G$ curves of the ULP transistor with source tied to ground. The $I_D/V_G$ of the standard NMOS device is shown too for comparison purpose. $I_D$ curves are presented for $V_D$ values ranging from 0.2V to 1V with 0.2V step.

First the case is considered when $V_D$=0.6V. In digital CMOS circuits, the gate of the transistors is the input and the drain is connected to the output. Cascading logic gates requires compatibility between input and output voltage levels. Therefore, a maximum value of $V_G$ is $V_D$ value. The end of the $I_D$ curve for $V_G > V_D$ is plotted in dashed line for explanation purpose. When $V_D$=0.6V, the increase in $V_G$ first has no impact on $I_D$ because only the sub-threshold current is rising and its rise is masked by the junction and gate leakage currents as for $I_{OFF,ULP}$ at 0.6V in FIG. 2. When $V_G$ increases a bit more, $I_D$ starts to rise as the sub-threshold current becomes higher than the junction and gate leakages. When $V_G$ gets higher than $V_D$, the NMOS device progressively leaves the weak inversion regime and when $V_G$ is higher than $V_D + V_T$, the NMOS device operates in strong inversion regime in linear (triode) region. It represents a small impedance between the gate and the drain of the PMOS, implying a very small voltage drop that can be neglected. The PMOS is thus operating as a reverse biased MOS diode. The current is becoming constant and equal to $I_{OFF,std}$ of the standard device. The ON-current of the ULP is thus related to the sub-threshold current of a PMOS device at $V_{gs}$=0V, which is equal to the sub-threshold current of the standard NMOS device, under the assumption of symmetrical threshold voltages and gate width ratio equal to the inverse of the carrier mobility ratio. The speed of the gates will thus be low.

As shown in FIG. 3, a change in the $V_D$ value has no impact on the ULP maximum $I_D$ ON-current $I_{ON,ULP}$ because this current is just the sub-threshold current of the PMOS device with low negative $V_{GS}$, corresponding to a voltage drop generated by the NMOS device with $V_g = V_d$. However, changing $V_D$ has an impact on $I_{OFF,ULP}$, as explained hereinabove, because the sub-threshold current is not effectively reduced for low $V_D$ values and because junction and gate leakages are increased for high $V_D$ values. In embodiments of the present invention, the optimal $V_D$ is 0.6V.

The N-type and the P-type ULP transconductance devices, e.g. transistors, proposed in accordance with embodiments of the present invention can be used in portable electronic circuits operated at slow speed or frequency, such as for example wrist watches, hearing prostheses, implanted or non-implanted biomedical devices e.g. pacemakers, networks of intelligent sensors, RFID, etc.

The N-type and the P-type ULP transconductance devices, e.g. transistors, proposed in accordance with embodiments of the present invention can be combined to build ULP CMOS logic gates with ultra-low static current. As an example only, a static ULP CMOS inverter is presented. The principle, however, may be extended to the design of other basic logic gates. Performances are compared hereinafter with standard CMOS gates under the same power supply voltage. Comparison is further carried out with other active-mode power consumption reduction techniques: sub-threshold operation, reverse body biasing and use of high-$V_T$ devices. As explained hereinabove, the figure of merit considered at application level is the total energy consumed over one task repetition period $T_{per}$. If $T_{per}$ is long, circuits can operate at low clock frequencies and energy consumption is dominated by static power dissipation. Therefore, the following figures of merit are considered at gate level: static current and total power consumption at low operating frequencies (i.e. 1 and 10 kHz). Delay of the gates is not of uttermost interest for ultra-low-power applications. However, the circuit has to support a clock frequency that allows the task execution time to be shorter than $T_{per}$. The total propagation delay between latches has to meet the timing constraints from this clock frequency requirement. For example, the primary clock frequency of wristwatches is 32 kHz, given by the properties of the quartz oscillator. This frequency is directly divided because the task is not heavy and can be achieved at lower clock frequency. Therefore, even in the clock divider, the part of the circuit operating at the highest speed, the gate delay can be in the μs range.

Figure 4:
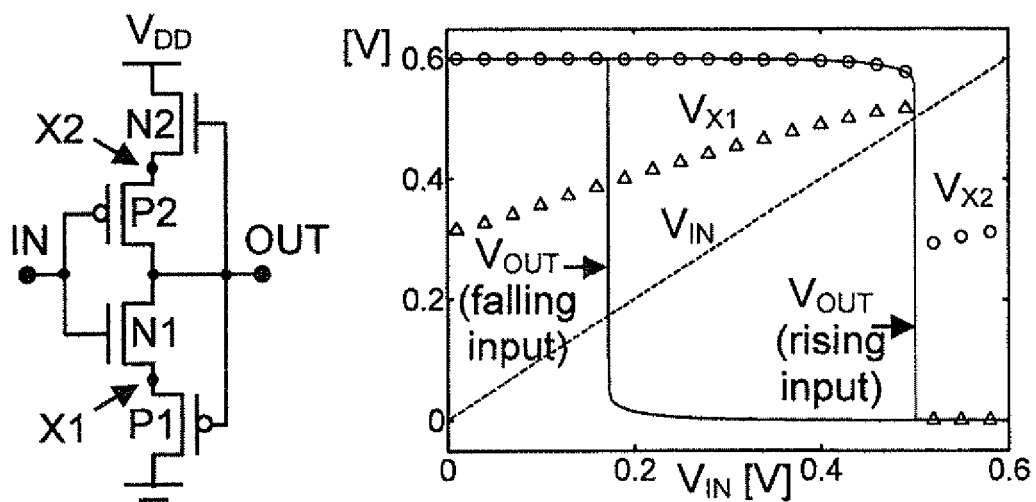
FIG. 4 illustrates the schematic of an ULP CMOS inverter according to an embodiment of the present invention, and its voltage transfer curve (plain lines: $V_{OUT}$, dashed line: $V_{IN}$, circles: $V_{X2}$, triangles: $V_{X1}$, SPICE simulation with $W/L_N=0.15/0.13$ [μm] and $W/L_P=0.4/0.13$ [μm], $V_{DD}=0.6$V, $T=27°$ C.).

In FIG. 4, the schematic of an ULP CMOS inverter according to an embodiment of the present invention is depicted. Such inverter is formed by a combination of the N-type and the P-type ULP transistors of embodiments of the present invention. There are 4 MOS devices (N1,P1,N2,P2) and 2 internal nodes (X1,X2). Again, the ratio between the widths of the devices is the inverse of the carrier mobility ratio. Devices have symmetrical $V_T$. The inverter according to embodiments of the present invention is based on the polarisation of the substrate of the devices.

The voltage transfer curve is simulated with SPICE with the same models as hereinabove. It is presented as well in FIG. 4. This curve presents hysteresis, the inverter switching voltage is different when the output node is high and when it is low, i.e. when the input is rising or falling. To explain this feature, a rising edge of the input voltage is considered. In FIG. 4, $V_{X1}$ and $V_{X2}$ are plotted in order to ease the explanation.

When $V_{IN}$=0V, $V_{OUT}$ is equal to $V_{X2}$ because P2 presents a very low equivalent impedance due to its high $V_{GS}$. As N2 is not reversely biased, its equivalent impedance is quite small as compared with N1 and P1, which have a large negative $V_{GS}$. $V_{X2}$ is thus equal to $V_{DD}$ and so $V_{OUT}$ is equal to $V_{DD}$. By symmetry in the N-type ULP transistor N1-P1, $V_{X1}$ is equal to $V_{DD}/2$ as explained hereinabove. In FIG. 4, $V_{X1}$ is a bit higher than $V_{DD}/2$ because of the mismatch between $V_T$ of the NMOS and PMOS devices.

When $V_{IN}$ increases, this symmetry on the $V_{GS}$ of N1 and P1 implies that $V_{X1}$ is close to $(V_{IN}+V_{OUT})/2$. $V_{OUT}$ remains close to $V_{X2}$ and thus close to $V_{DD}$.

When $V_{IN}$ gets close to $V_{X1}$, N1 leaves the weak inversion regime, discharging $V_{OUT}$ to $V_{X1}$. This fall of $V_{OUT}$ increases $V_{GS}$ of P1 and decreases $V_{GS}$ of N2, discharging $V_{OUT}$ even faster. This leads to a sharp transition of $V_{OUT}$.

Similar reasoning can be applied to the case of a falling input. The switching voltages for a rising input edge and a falling input edge are not exactly symmetrical because of the mismatch between $V_T$ of the NMOS and PMOS devices (0.26V and 0.31V, respectively). The hysteresis provides a high static Noise Margin (NM) for the inverter: $NM_H$=0.71 and $NM_L$=0.83 (normalized to $V_{DD}$=0.6V).

Figure 5:
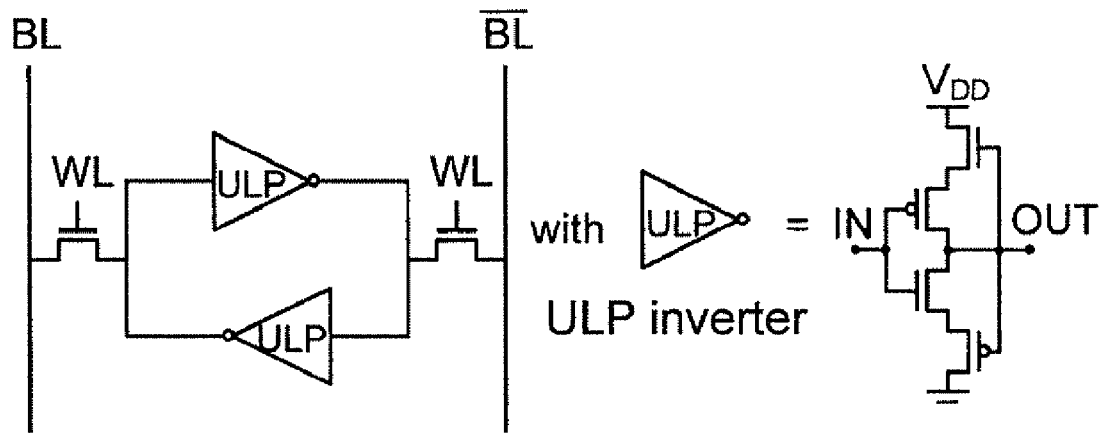
FIG. 5 schematically illustrates a standard SRAM cell architecture with ULP inverters.
Figure 6:
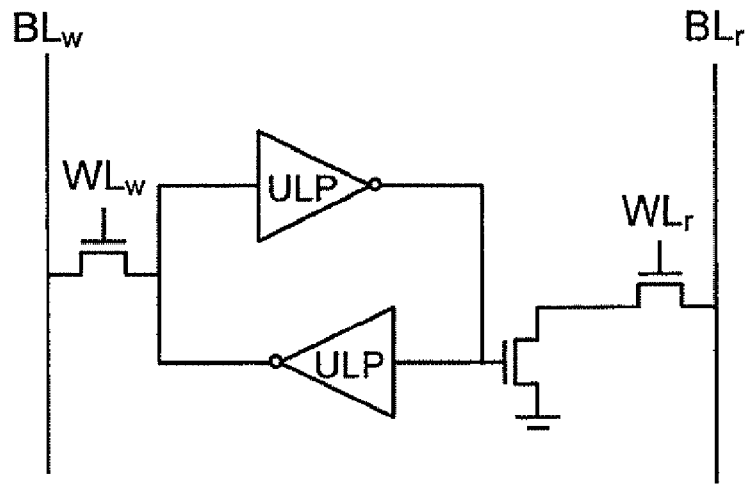
FIG. 6 schematically illustrates a standard SRAM cell architecture with ULP inverters and buffered output.
Figure 6:
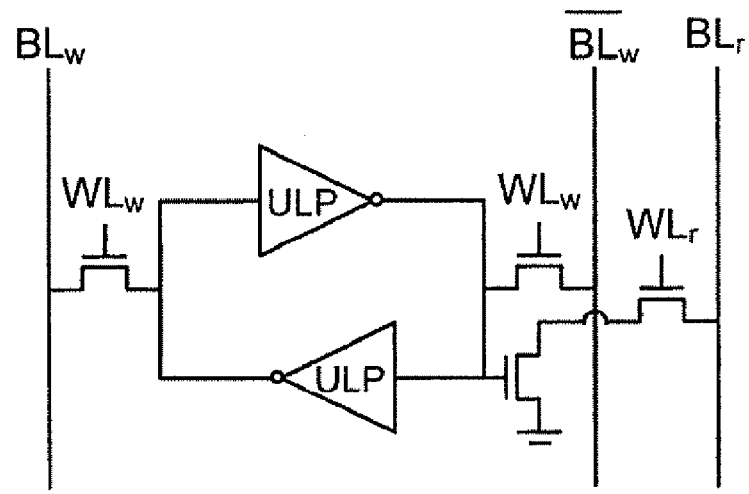
Figure 7:
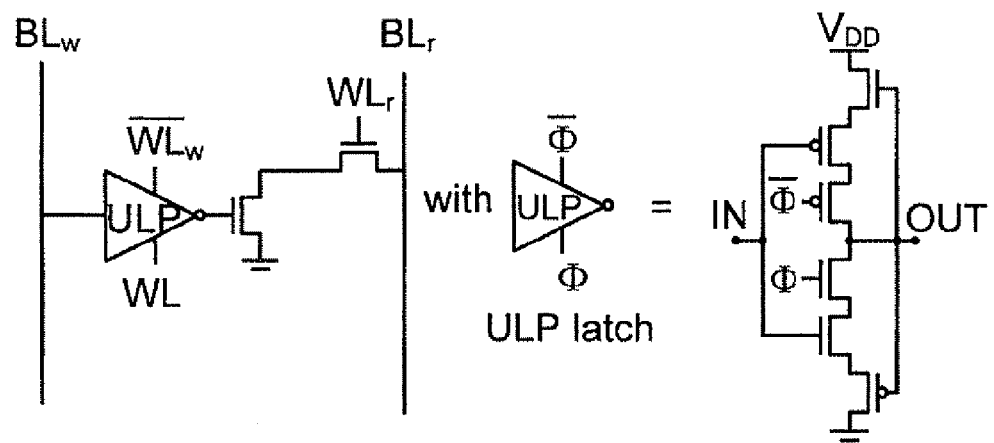
FIG. 7 schematically illustrates an SRAM cell architecture with ULP latches and buffered output.

The hysteresis present in the transfer characteristic of voltage between input and output of the ULP CMOS inverter as illustrated in FIG. 4 may be interesting in low-voltage ultra-low-power RAM (random access memory) memories with sufficient noise margins as proposed by J. P. Kulkarni, K. Kim and K. Roy in "A 160 mV Robust Schmitt Trigger Based Subthreshold SRAM", IEEE Journal of Solid-State Circuits, Vol. 42 (30), 2007, pp. 2303-2313. Therefore, a logic gate of the inverter type according to embodiments of the present invention may be used for making RAM memories with very low power consumption and having noise margins above $V_{DD}/2$. FIG. 5 shows standard SRAM (static random access memory) cell architectures with ULP inverters. In this figure BL and WL indicate respectively bit lines and word lines. It is based on the same operation as a conventional 6-transistor SRAM cell but according to embodiments of the present invention, ULP inverters replace conventional static CMOS inverters. The unique noise margins of an ULP inverter provides a high hold noise margin for the SRAM cell. FIG. 6 shows 2 standard SRAM cell architectures with ULP inverters and buffered output: one with single write and one with differential write. In this figure, the w and r indices respectively stand for write and read operations. An output buffer decouples the read BL from the SRAM cell and thus ensures a read noise margin as high as the hold noise margin. FIG. 7 illustrates a new SRAM cell architecture with ULP latches and a buffered output.

Figure 8:
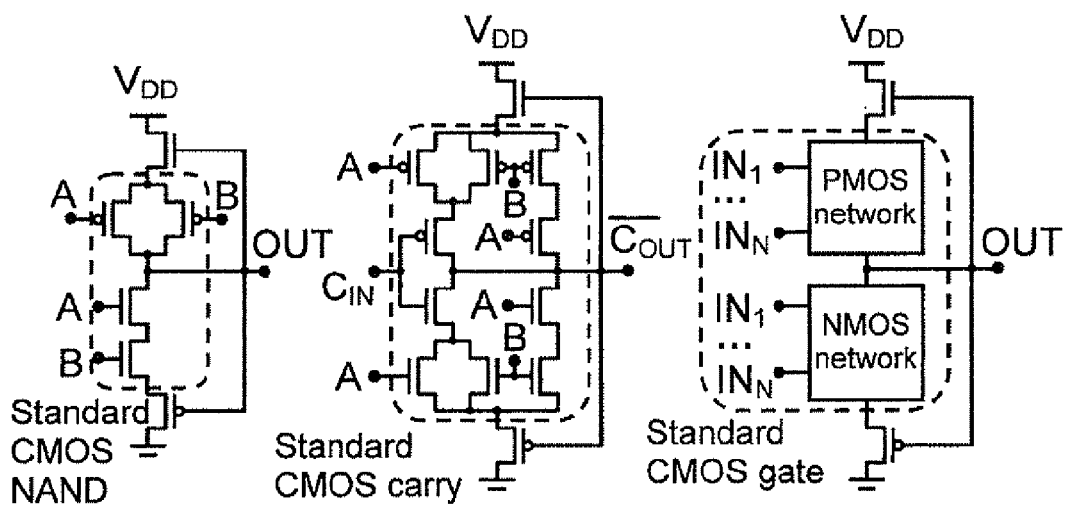
FIG. 8 schematically illustrates basic ULP CMOS logic gates according to embodiments of the present invention: NAND, carry and general structure of a logic gate.

From the ULP inverter structure according to embodiments of the present invention, a wide range of logic gates can be designed. FIG. 8 shows the schematic of a two-input ULP NAND gate, an ULP carry gate and general structure of logic gate. The general structure of an ULP gate in accordance with embodiments of the present invention can be viewed as a standard CMOS gate with 2 leakage-gating extra devices whose gates are connected to the output. This connection acts as a feedback loop. When output is high, the upper NMOS device is ON whereas the lower PMOS device is OFF and cuts off the sub-threshold leakage current further. The series connection of the transistors inside the logic gates has a very small impact on the static current, on the static noise margin and on the delay, even without doubling device width as it is done with standard CMOS gates. Therefore, as low-power applications are targeted, devices are minimum sized ($W/L_N$=0.15/0.13 and $W/L_P$=0.4/0.13 [μm]), in order not to increase the dynamic power consumption through the total switched capacitance.

Transient SPICE simulations of the ULP CMOS logic gates have been carried out. Table I shows the average static current, the delay and the average power consumption for random data pattern at 1-kHz and 10-kHz data rates. A fanout of 4 identical gates is used. Gates are operating under 0.6V power supply.

TABLE I

Performances of ULP logic gates

| Gate | $V_{DD}$ [V] | $I_{STAT}$ | Delay | Power @1 kHz | Power @10 kHz |
|---|---|---|---|---|---|
| ULP inverter | 0.6 | 3.0 pA | 8.3 μs | 2.6 pW | 8.7 pW |
| ULP NAND | 0.6 | 3.7 pA | 8.5 μs | 2.9 pW | 9.0 pW |
| ULP carry | 0.6 | 5.5 pA | 9.0 μs | 4.3 pW | 13.1 pW |

ULP CMOS logic gates operate with very low static current in the pA range. The delay is long, in the ps range but enables the implementation of low-frequency circuits. The total power consumption is in the pW range. For the carry gate, the delay in Table I is the $C_{IN}$-to-$\overline{C_{OUT}}$ delay. Delays of the various ULP gates in accordance with embodiments of the present invention are very similar. The average static current is higher for the NAND and the carry because the drain-to-body junction leakage increases with the device count. At 1 kHz, total power consumption is dominated by static power and thus proportional to static current. At 10 kHz, dynamic power consumption dominates and depends on the activity factor. With random data pattern, the activity factor of the inverter, the NAND and carry are 0.5, 0.4, 0.5, respectively. Despite its higher switched capacitance, power consumption of the NAND is similar to the power of the inverter because its activity factor is lower. Power of the carry is higher because of its higher static current and switched capacitance.

For comparison purpose, Table II presents the simulated performances of the ULP inverter and of the standard CMOS inverter under the same operating conditions.

TABLE II

Performance comparison of inverters

| Type | $V_{DD}$ [V] | $I_{STAT}$ | Delay | Power @1 kHz | Power @10 kHz |
|---|---|---|---|---|---|
| ULP | 0.6 | 3.0 pA | 8.3 μs | 2.6 pW | 8.7 pW |
| Standard | 0.6 | 3.0 nA | 0.10 ns | 1.8 nW | 1.8 nW |
| Std SUB | 0.6 | 1.6 nA | 3.7 ns | 0.31 nW | 0.31 nW |
| Std RBB | 0.6 | 15.8 pA | 0.38 ns | 9.9 pW | 13.2 pW |
| Std high-$V_T$ | 0.6 | 0.15 nA | 0.33 ns | 91.4 pW | 96.7 pW |

The ULP inverter has a delay higher by 5 orders of magnitude. However, its static current is lower by 3 orders of magnitude. Due to its high static current, static power consumption dominates for the standard inverter at 1 and 10-kHz data rates, leading to similar total power at both frequencies. The use of the ULP inverter reduces the power consumption by 600 at 1 kHz and by 200 at 10 kHz.

Figure 9:
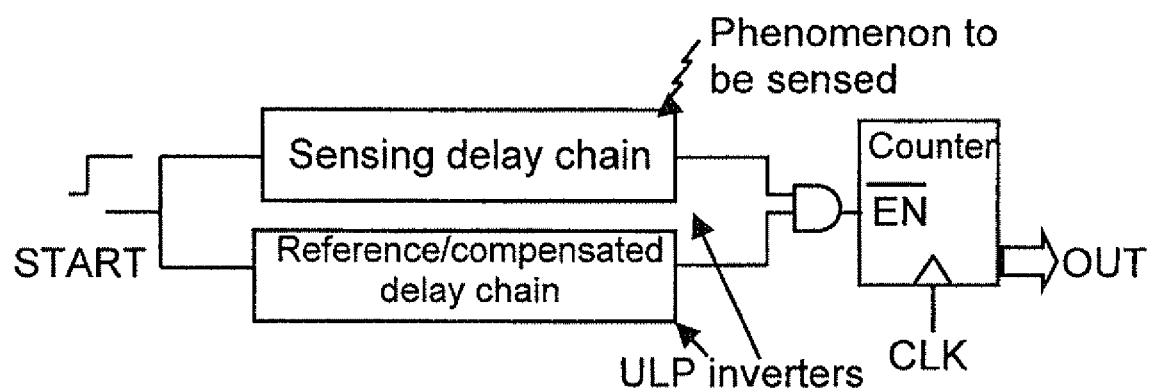
FIG. 9 schematically illustrates a time-to-digital converter based on ULP inverters according to embodiments of the present invention.

The long delay of logic gates according to embodiments of the present invention may be used for realising time-to-digital converters (TDC) with very low power consumption. This type of converters may be used in integrated sensors, such as temperature sensors, flux sensors, pressure sensors, etc. FIG. 9 illustrates such a time-to-digital converter.

Figure 10:
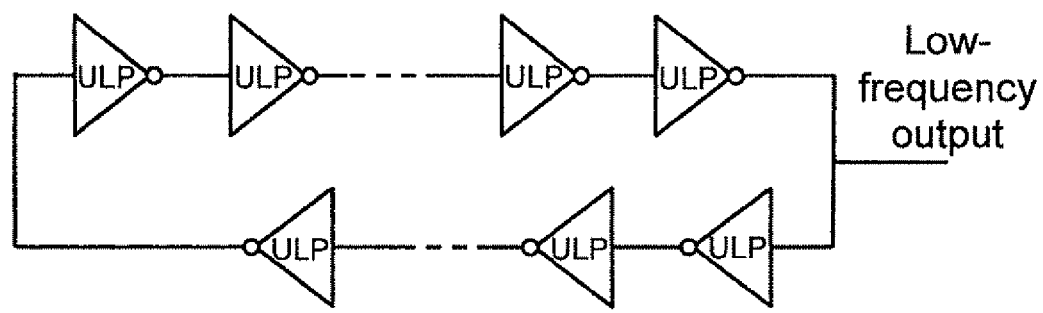
FIG. 10 schematically illustrates a ring oscillator based on ULP inverters according to embodiments of the present invention.
Figure 11:
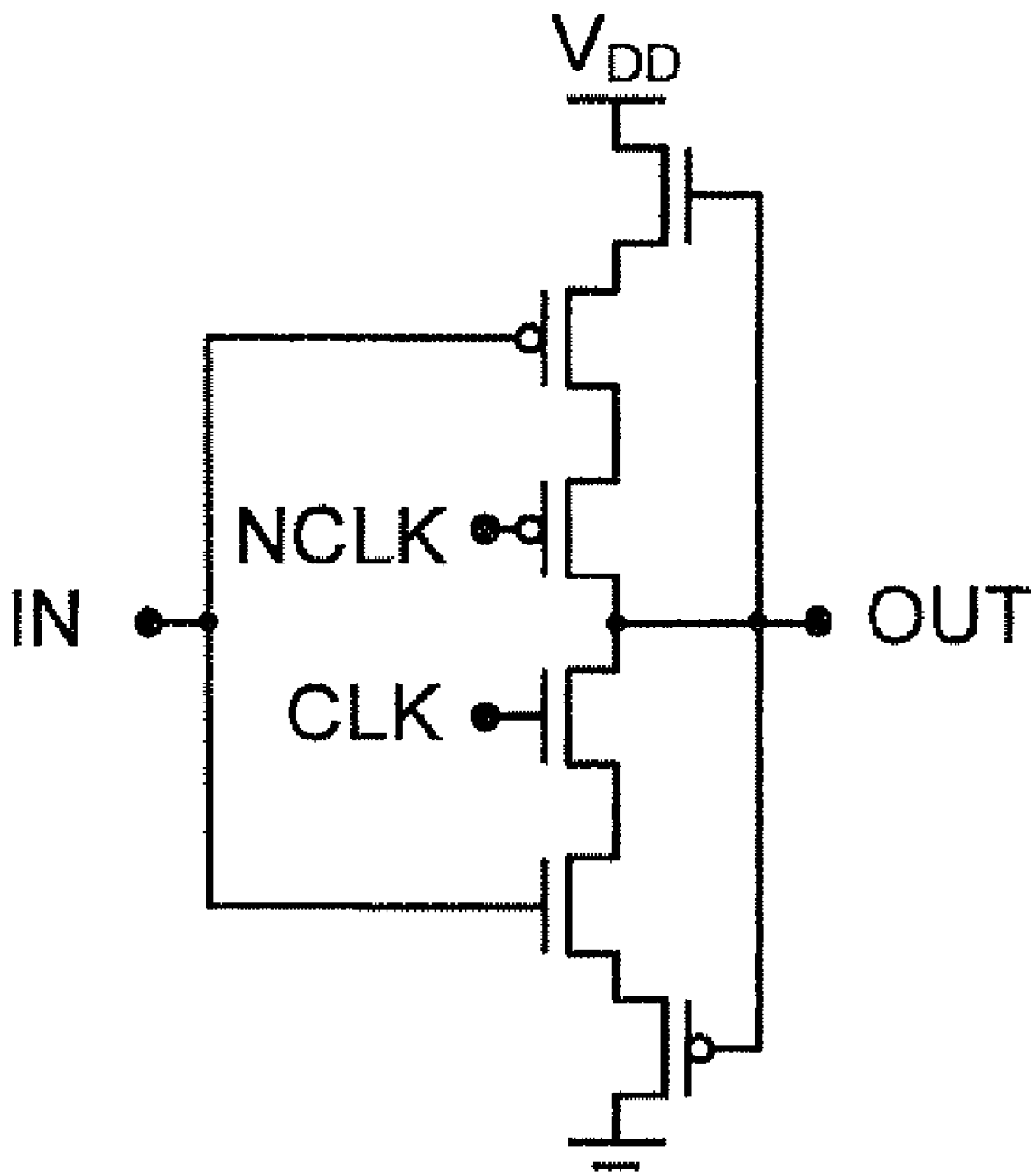
FIG. 11 illustrates the structure of a latch according to an embodiment of the present invention.
Figure 12:
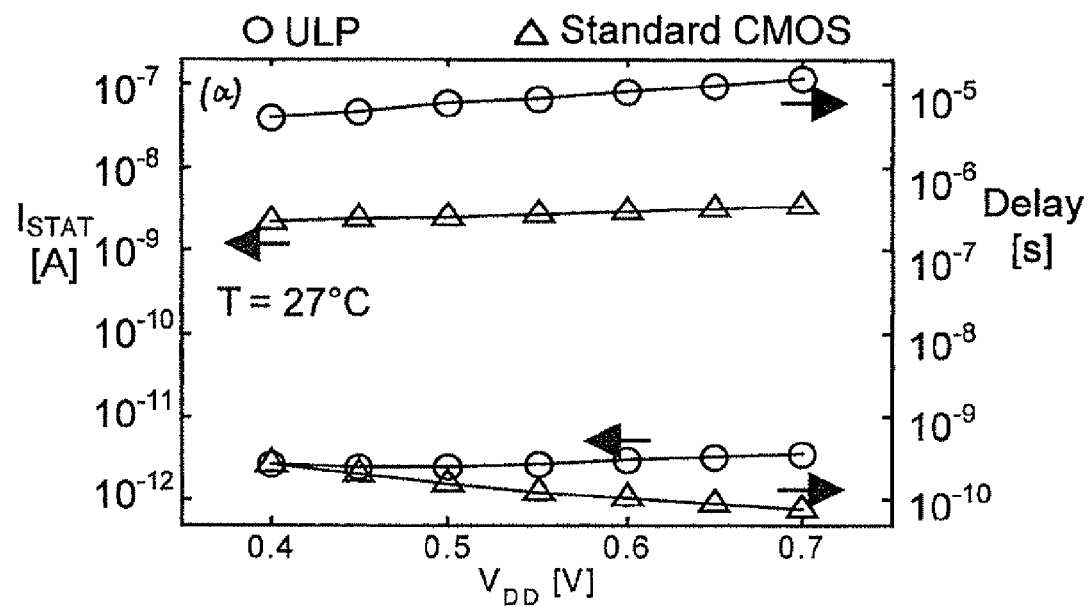
FIG. 12 illustrates static current and delay of the inverter according to embodiments of the present invention against voltage variations (SPICE simulations).
Figure 13:
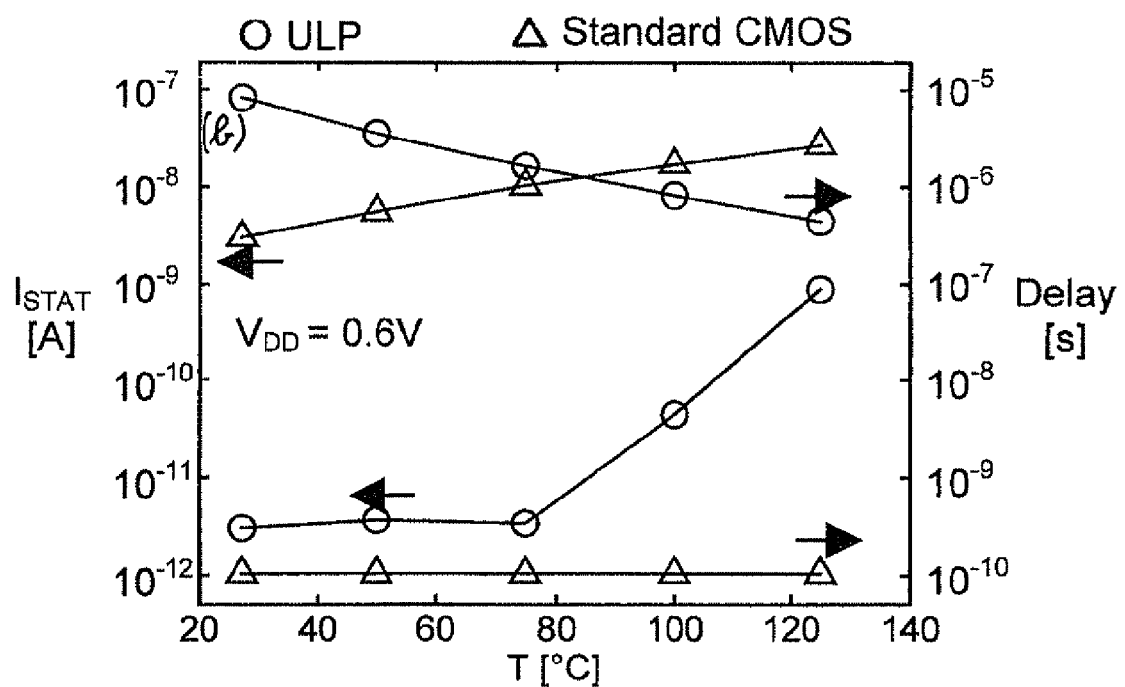
FIG. 13 illustrates static current and delay of the inverter according to embodiments of the present invention against temperature variations (SPICE simulations).

The long delay property of the ULP inverter can also be used to build small ring oscillators with low oscillation frequency and therefore low power consumption, as shown in FIG. 10 in which a time-do-digital converter based on ULP inverters is illustrated. As the delay of the ULP inverter exponentially depends on the device threshold voltage, such a ring oscillator can be used to monitor the global or local process variations through measurement of its oscillation frequency.

In order to further evaluate the efficiency of the ULP logic gates in accordance with embodiments of the present invention for low power, comparison is presented in Table II with traditional active-mode low-power techniques. The first technique is to operate the standard gate in sub-threshold (SUB) regime with very low power supply. In Z.-H. Liu, Ch. Hu, J.-H. Huang, T.-Y. Chan, M.-Ch. Jeng, P. K. Ko and Y. C. Cheng: "Threshold Voltage Model for Deep-Submicrometer MOSFET's", IEEE Trans. On Electron Devices, Vol. 40 (1), 1993, pp. 86-95, a ring oscillator on an 0.18-μm process has the lowest working power supply of 0.26V to retain 10%-90% output swing under the various process corners. For the 0.13-μm process considered here, 0.2V was chosen as the power supply for sub-threshold operation, which is quite an aggressive choice. This reduces total power of the CMOS inverter by 5. However, even with this aggressive voltage scaling, power consumption of the CMOS inverter remains much higher than the power consumption of the ULP inverter.

The second technique is the application of a Reverse Body Bias (RBB) to increase the device threshold voltage. The RBB that minimizes the static current is 3V. At higher RBB, junction leakage becomes higher than sub-threshold leakage and increases the total static current. Application of 3V RBB leads to very low total power consumption. It is comparable but at least higher by 50% than total power of ULP inverter with the overhead of the need for 2 extra 3V-bias voltage supplies, which is a problem regarding to the integration of low-cost ultra-low-power circuits. Finally, high-VT devices can be used if available. Table III shows the simulated performance of the standard inverter with the high-VT devices (0.36V for NMOS and −0.38V for PMOS) from the considered 0.13-μm CMOS process.

TABLE III

Performances of the ULP inverter against process variations

| Corner | $NM_L$ ULP | $NM_H$ ULP | $I_{STAT}$ ULP | Delay ULP | $I_{STAT}$ std | Delay std |
|---|---|---|---|---|---|---|
| FF | 0.83 | 0.71 | 3.6 pA | 2.7 μs | 9.7 nA | 0.08 ns |
| FS | 0.89 | 0.62 | 3.0 pA | 12.9 μs | 5.2 nA | 0.10 ns |
| TT | 0.83 | 0.71 | 3.0 pA | 8.3 μs | 3.0 nA | 0.10 ns |
| SF | 0.74 | 0.81 | 3.0 pA | 8.1 μs | 2.7 nA | 0.10 ns |
| SS | 0.84 | 0.71 | 2.8 pA | 20.1 μs | 1.2 nA | 0.13 ns |

(Corner description: first letter = NMOS, second letter = PMOS, F = Fast, S = Slow, T = Typical, $NM_L$ and $NM_H$ are normalized to $V_{DD}$ = 0.6 V)

Power consumption is reduced as compared to a standard inverter but remains at least one order of magnitude higher than with ULP inverter. The ULP logic gate is thus demonstrated as a very efficient leakage reduction technique at low-cost.

In alternative embodiments of the present invention, besides combinational logic gates as discussed above, also sequential logic gates form part of the present invention. As an example only, a latch is illustrated in FIG. 8. Such latches can be combined to form trigger circuits, or they can be used separately as latch or memory circuit.

Hereinafter, performances of the ULP CMOS inverter are simulated against process, voltage and temperature variations in order to validate the reliability of the ULP transistor concept.

In advanced CMOS processes, variability of process parameters is an important issue for designers. Table III shows the SPICE-simulated static Noise Margins (NM) of the ULP CMOS inverter, normalized to $V_{DD}$ for the various process corners. FS (Fast NMOS, slow PMOS) corner gives the highest difference between $NM_L$ and $NM_H$ because this corner increases the inherent mismatch between $V_T$ of the NMOS and of the PMOS. Static noise margins remains higher than $V_{DD}/2$ thanks to the hysteresis of voltage transfer curve from FIG. 4. This is never achieved with standard CMOS gates. Table II shows the static current and the delay of the ULP CMOS inverter and of the standard CMOS inverter. Static current of the ULP inverter is very stable, whereas the worst-case static current of the standard inverter is 3 times higher than for the typical corner. Delay of the ULP inverter varies significantly with the process corner but still enables operating frequencies in the kHz range.

Performance dependence on voltage variations determines robustness and scalability. SPICE-simulations of the ULP inverter according to embodiments of the present invention show less than 10% variations in the static noise margins normalized to $V_{DD}$ for voltage from 0.4V to 0.7V. The ULP inverter according to embodiments of the present invention is thus scalable and robust. Static current and delay are plotted against $V_{DD}$ in FIG. 6 and compared to standard CMOS. Static current of the ULP inverter has a minimum value round 0.45V. As shown in FIG. 2, higher $V_{DD}$ values imply higher junction leakage. Lowest $V_{DD}$ values imply higher sub-threshold leakage. Static current variations are very low (maximum 20%). Delay increases with $V_{DD}$ because maximum ON-current remains unchanged when $V_{DD}$ increases as stated in Section 3.3, whereas the output node swing increases. It still enables kHz-range operating frequencies for a wide $V_{DD}$ range.

Performance dependence on temperature determines the robustness against environmental conditions. The noise margins are modified by less than 5% when operating at 125° C. An ULP inverter according to embodiments of the present invention is thus able to operate at this temperature. Static current and delay for various temperatures are shown in FIG. 7 and are compared to standard CMOS. Delay of the standard inverter is very insensitive to temperature as 0.6V is close to the Zero-Temperature-Coefficient (ZTC) point for the considered technology. Delay of the ULP inverter decreases with temperature because ON-current increases. For the considered 0.13-μm technology, junction leakage is quite insensitive to temperature variations until 150° C. because Band-To-Band Tunneling (BTBT) mechanism dominates. Under 0.6V, static current of ULP gates is mainly due to junction leakage until 75° C. Static current thus remains quite stable for this temperature range. However, at higher temperatures, sub-threshold current becomes higher than junction leakage and the static current increases. This increase is faster than for standard CMOS as the dependence of the ULP transistor OFF-current on the temperature is stronger, as shown by the multiple occurrences of the $U_{th}$ term in Equation (4).

If the circuit has to operate in high temperature environment, the rise of the static current can be limited by using higher $V_{DD}$ value. As shown in Equation (4) and FIG. 2, this will lead to limitation of the sub-threshold current. For example at 125° C., a power supply of 0.85V brings the sub-threshold current back to the junction leakage level. With these conditions, static current of the ULP inverter is as low as 5.0 pA as shown in Table IV. This makes ULP CMOS gates very suitable for ultra-low-power high-temperature applications.

TABLE IV

High-temperature behaviour of the ULP inverter according to embodiments of the present invention against VDD

| $V_{DD}$ [V] | $I_{STAT}$ at 27° C. | Delay at 27° C. | $I_{STAT}$ at 125° C. | Delay at 125° C. |
|---|---|---|---|---|
| 0.6 | 3.0 pA | 8.3 μs | 880 pA | 0.44 μs |
| 0.85 | 4.8 pA | 17.6 μs | 5.0 pA | 0.92 μs |

It is to be understood that although preferred embodiments, specific constructions and configurations have been discussed herein for devices according to the present invention, various changes or modifications in form and detail may be made without departing from the scope and spirit of this invention.

The invention claimed is:

1. An ultra-low-power transconductance device comprising:
 a series connection of a transistor of a first channel type and a transistor of a second channel type, the first channel type having a different polarity than the second channel type, the transistors each having a source, a drain and a gate,
 wherein the source of the transistor of the first channel type is coupled with the source of the transistor of the second channel type, and the drain of the transistor of the first channel type is coupled with the gate of the transistor of the second channel type, the transistor of the second channel type having a sufficient resistance between its drain and source, that a drain-source voltage drop across the transistor of the second channel type is at least 40% of a voltage drop across both transistors, wherein the transistors of the first channel type and the transistors of the second channel type are enhancement-type transistors.

2. The ultra low power transconductance device of claim 1, the voltage drop across both transistors being substantially 0.5 when the device is off and being nearly 1 when the device is on.

3. An ultra-low-power transconductance device according to claim 1, wherein a body of the transistor of the first channel type is connected to ground and a body of the transistor of the second channel type is connected to a power supply.

4. An ultra-low-power logic gate circuit, comprising at least one ultra-low power transconductance device of claim 1.

5. An ultra-low-power inverter circuit wherein a first and a second ultra-low power transconductance device according to claim 1 are connected together, each of the ultra-low-power transconductance devices having a gate, a source and a drain, the first channel type of the first ultra-low power transconductance device being different from the first channel type of the second ultra-low-power device, wherein the drains of the first and the second ultra-low-power device are connected together and wherein the gates of the first and the second ultra-low-power transconductance device are connected together.

6. A ring oscillator comprising a plurality of ultra-low-power inverter circuits according to claim 5 connected to each other in series.

7. An SRAM cell comprising at least one ultra-low-power inverter circuit according to claim 5.

8. A time-to-digital converter comprising at least one ultra-low-power inverter circuit according to claim 5.

9. A latch comprising at least one ultra-low-power inverter circuit according to claim 5.

* * * * *